(12) United States Patent
Angel

(10) Patent No.: US 7,298,184 B2
(45) Date of Patent: Nov. 20, 2007

(54) FREQUENCY DIVIDER CIRCUIT WITH CONTROLLABLE FREQUENCY DIVISION RATIO AND METHOD FOR FREQUENCY DIVISION IN A FREQUENCY DIVIDER CIRCUIT

(75) Inventor: Jörn Angel, Bochum (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/513,655

(22) Filed: Aug. 31, 2006

(65) Prior Publication Data

US 2007/0052458 A1 Mar. 8, 2007

Related U.S. Application Data

(63) Continuation of application No. PCT/DE2005/000342, filed on Mar. 1, 2005.

(30) Foreign Application Priority Data

Mar. 1, 2004 (DE) .................... 10 2004 010 405

(51) Int. Cl.
*H03K 23/00* (2006.01)
(52) U.S. Cl. ...................... 327/115; 327/117
(58) Field of Classification Search ................ 327/115, 327/117; 377/47, 48
See application file for complete search history.

(56) References Cited

U.S. PATENT DOCUMENTS

| | | | |
|---|---|---|---|
| 5,062,126 A | 10/1991 | Radys | 377/51 |
| 5,195,111 A | 3/1993 | Adachi et al. | 377/48 |
| 5,969,572 A * | 10/1999 | Jeong et al. | 330/149 |
| 6,127,863 A | 10/2000 | Elliott | 327/115 |

FOREIGN PATENT DOCUMENTS

EP 0 746 108 A2 12/1996

OTHER PUBLICATIONS

"A CMOS Frequency Synthesizer with an Injection-Locked Frequency Divider for a 5-GHz Wireless LAN Receiver", Hamid R. Rategh, Hirad Samavati and Thomas H. Lee, IEEE Journal On Solid-State Circuits, vol. 35, No. 5, May 2000, 8 pgs.

"A 27-mW CMOS Fractional-*N* Synthesizer Using Digital Compensation for 2.5-Mb/s GFSK Modulation", Michael H. Perrott, Theodore L. Tewksbury III and Charles G. Sodini, IEEE Journal Of Solid-State Circuits, vol. 32, No. 12, Dec. 1997, 13 pgs.

* cited by examiner

*Primary Examiner*—Linh My Nguyen
(74) *Attorney, Agent, or Firm*—Eschweiler & Associates, LLC

(57) ABSTRACT

A frequency divider circuit is disclosed with at least one push-pull divider with adjustable division ratio and a connected converter device. The circuit converts a clock signal delivered by a push-pull divider into a single-ended signal. A first and a second single-ended divider are connected to the output of the converter device, and a feedback path is provided, which is connected to the output of the push-pull divider and to the outputs of the first and of the at least one second single-ended divider, and which includes an evaluation circuit. This circuit has first and second inputs which are connected to the first and second single-ended dividers in such a way that a future state of the clock signal delivered by the single-ended divider in question can be supplied to the inputs of the evaluation circuit. The evaluation circuit evaluates states of the clock signals delivered by the first and second single-ended dividers, i.e., states which will not exist until after future switching functions have been performed. As a result, additional time is gained for converting the signal to be divided from a push-pull signal to a single-ended signal.

18 Claims, 5 Drawing Sheets

US 7,298,184 B2

FREQUENCY DIVIDER CIRCUIT WITH CONTROLLABLE FREQUENCY DIVISION RATIO AND METHOD FOR FREQUENCY DIVISION IN A FREQUENCY DIVIDER CIRCUIT

REFERENCE TO RELATED APPLICATIONS

This application is a continuation of PCT/DE2005/000342 filed Mar. 1, 2005 which was not published in English, that claims the benefit of the priority date of German Patent Application No. DE 10 2004 010 405.0, filed on Mar. 1, 2004, the contents of which both are herein incorporated by reference in their entireties.

FIELD OF THE INVENTION

The invention pertains to a frequency divider circuit with a controllable frequency division ratio and to a method for the operation of a frequency divider circuit with a controllable frequency division ratio.

BACKGROUND OF THE INVENTION

Frequency divider circuits are used, for example, in phase-locked loops of modem communications systems. Phase-locked loops are used to generate a stable signal with a precise frequency. One of the components of a phase-locked loop is a frequency divider circuit, which steps down the frequency of the clock signal generated by the high-frequency oscillator of the phase-locked loop. The stepped-down signal is sent to a phase comparator of the phase-locked loop; the comparator then compares the stepped-down signal with a reference signal and generates an adjusting signal for the oscillator. The phase-locked loop continues to adjust the output frequency of the oscillator until the frequency-divided signal from the frequency divider circuit and the reference signal have the same frequency.

So that a phase-locked loop of this type can generate stable signals at various frequencies, it is necessary for the division ratio in the frequency divider circuit to be adjustable. The frequency divider can thus be switched between various division values. An appropriate control signal is used to set the division ratio to the desired value. A frequency divider circuit with adjustable division ratio is sometimes called a "multimodulus" divider.

FIG. 6 shows part of a known multimodulus divider. The divider shown here comprises essentially a cascade of switchable divider stages, three of which T1-T3 are illustrated. The individual divider stages are connected in series. Each divider stage is designed as a synchronous divider, which divides an input signal by a factor of 2 or by a factor of 3 as a function of the control signal C0, C1, or C2 at its control input 212. This can be explained most clearly on the basis of the synchronous divider stage T2 as an example.

The synchronous divider stage T2 comprises two flip-flop circuits F1 and F2, the clock inputs of which are connected to the input 13 of the synchronous divider stage T2. The data input D of the first flip-flop F1 is connected to the control input 212. The data output Q of the second flip-flop F2 leads to the output 14 of the synchronous divider T2 and is simultaneously connected to a first input A of a logical NAND gate N1. A second input B of the logical NAND gate N1 is connected to the data output Q of the first flip-flop F1.

A high level of a signal is called "logical 1" in the following, whereas a low level is called "logical 0". When the control signal at the input 212 is at logical 1, a logical 1 is sent from the data output of the first flip-flop to the input B of the NAND gate N1 each time a rising edge of a clock signal arrives at the input 13. The gate N1 in front of the data input D of the second flip-flop F2 then behaves like an inverter, which returns the output signal at the data output Q of F2 via the gate N1 to the data input D. Because, with each rising edge of a clock signal at the input 13, the data output Q of the second flip-flop inverts its state, a signal of half the frequency is present there. The divider T2 therefore divides the frequency of the clock signal present on the input side by 2.

When the control signal present at the control input 212 is at logical 0 at the time that the overall output 14 is at logical 0, and when, in addition, a rising edge arrives at the clock inputs of the flip-flops F1 and F2, the data output Q of the first flip-flop F1 changes to logical 0 and thus forces a logical 1 at the output of the NAND gate N1. At the same time, the overall signal at the output 14 changes to logical 1. The control signal at the input 12 remains at logical 0 even during the second rising edge, so that the overall output continues to send a clock signal at logical 1. This corresponds to the insertion of an extra pulse with half the cycle duration.

After the second rising edge of the clock signal has arrived at the input 13, the control signal at the input 212 is set back to the original state, and another frequency division of the input-side clock signal by the factor of 2 is carried out in the divider stage T2. The suppression of the switching operation thus brings about a division by the factor of 3. This means that an additional positive half-wave is inserted, whereas the negative half-wave retains its original duration.

The divider stages T1, T2, and T3 shown here are based on this concept of suppressing the switching operation. These dividers are therefore also called ⅔-dividers. The lowest division ratio of a cascade consisting of ⅔-dividers is, when these are dividing only by 2. Sending a control signal designed to suppress precisely one clock cycle of the input clock signal corresponds to a division ratio equal to the minimum division ratio $n_{min}+1$. To achieve this, the very first divider of the chain must divide by 3 exactly once per complete cycle and otherwise by 2. For a division ratio which corresponds to the minimum division ratio plus 2, the first divider operates with a constant division ratio of 2, whereas the second divider of the chain suppresses one switching operation per complete cycle and thus divides by the factor of 3. For the next division ratio of the overall cascade, the first two divider stages must each divide once per complete cycle by the factor of 3. This binary-weighted scheme can be continued to generate all of the division ratios from the series-connected dividers, ranging from the minimum ratio $n_{min}$, when all are dividing only by 2, to the ratio $2*n_{min}-1$.

In the partial view of prior art FIG. 6, the individual control signals for the dividers T1, T2, and T3 are supplied by the control signals C0, C1, and C2, each of which is sent to a logical NAND gate 21 or 21A. This ensures that the corresponding control signal C0, C1, or C2 is always present at the data input D of the first flip-flop F1 of each divider circuit at the beginning of a complete cycle of the divided clock signal available at the output.

For this purpose, a feedback branch is provided. For each divider stage T1-T3, the feedback branch comprises an inverter 22, which is connected to the associated output 14 of the divider stage T1-T3. The outputs of the inverters 22 of the divider circuits T1 and T2, neither of which is the last divider circuit of the overall chain, are each connected to an input B of a logical NAND gate U1, U2. The output of the inverter 22A in the feedback path, this inverter being assigned to the last divider stage T3, is connected both to the input A of the logical NAND gate 21 A and to the input A of the logical NAND gate U2 of the feedback path, this gate being assigned to the divider T2.

The NAND gates 21 and 21A in front of the control inputs 212 of the divider stages T1-T3 are never released by the signals at the input A until all of the following divider stages have a logical 0 at their output. A low logical level of the output signals of all the divider stages T1, T2, T3 in the divider chain, however, means the end of a complete cycle. As a result, a logical 1 is now present at the inputs A, and the control input 212 of the divider stage T1, T2, T3 in question is released. When a rising edge then arrives at the clock input of each divider stage, the corresponding control signal C0, C1, or C2 is sent to the data input of the first flip-flop of the divider stage. Depending on the control signal, the frequency is divided by a factor of 2 or 3. As soon as the signal at the overall output of the divider stage T1 has a value of logical 1, the fact that the NAND 21 is now in the blocking state means that the feedback generates a logical 1 again at the control input 212 of the corresponding divider stage.

The travel time of the feedback signal through the individual logical gates U, however, can be problematic. To guarantee error-free operation when the division ratio is selected, the feedback signal generated by the AND gates U1 and U2 must have released the NAND gate 21, 21A of each divider stage by the time a rising edge of the clock signal CLK arrives at the input of the first divider stage T1. This determines the maximum input frequency of the clock signal CLK on the input side. Delays in the feedback path should therefore be avoided.

For systems with high and very high-frequency input CLK signals, furthermore, the first divider stages should be based on the push-pull technique. The concept of the push-pull technique refers here to difference-signal processing. A push-pull signal is the difference between two signals. The advantages of processing push-pull signals are the greater insensitivity to interference signals and the simplicity of implementation.

In the known exemplary embodiment according to FIG. 6, the divider stage T1 is designed for push-pull signal processing. It is also possible to speak here of a "push-pull divider" T1. For the processing of signals with lower frequencies, divider stages based on the single-ended technique are typically employed. Single-ended dividers are usually designed on the basis of CMOS logic and are slower but, in contrast to the push-pull dividers, they have no static power consumption. In the exemplary embodiment of prior art FIG. 6, the divider stages T2 and T3 are designed as single-ended divider stages. Two converter stages 24 and 25 are required for this heterogeneous structure of a multimodulus divider. The converter stage 24 is connected between the output of the divider T1 and the input of the divider T2 and converts the push-pull signal sent from the push-pull divider stage T1 to a single-ended signal. For the feedback path, a corresponding converter stage 25 is provided, which converts the fed-back single-ended signal to a corresponding push-pull signal.

The conversions performed by the converters, especially by the converter 25, however, cause delays, which in particular reduce the maximum frequency of the input signal. In the known designs, therefore, the single-ended dividers T2 and T3, which are advantageous because of their low power consumption, can be used only in the rear area of a divider cascade, where low frequencies are already present and thus there is sufficient time available for the conversion.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention is directed to a frequency divider circuit with an adjustable frequency division ratio, in which the delays caused by the conversion stage in the feedback path are minimized. The invention is also directed to a method for operating a frequency divider circuit of this type.

In one embodiment, the inventive frequency divider circuit comprises a push-pull divider with a division ratio which can be adjusted at a control input. The push-pull divider is configured for suppressing switching. A first clock signal at a first frequency is supplied to an input of the push-pull divider, and the push-pull divider is configured to deliver a second clock signal at a second frequency. The second frequency can be adjusted by a control signal at the control input. The push-pull divider thus divides the frequency of a signal sent to the input side by the division ratio set at the control input and thus makes a clock signal with the divided frequency available at the output. The frequency divider circuit also comprises a first converter device, which is connected to the output of the push-pull divider and which is configured to convert a push-pull signal to a single-ended signal. A first single-ended divider is connected to the output of the first converter device, and a second single-ended divider is connected downline from the first single-ended divider. The first and second single-ended dividers are configured to deliver third and fourth clock signals, respectively, where the frequencies of the third and fourth clock signals are derived from the frequency of a clock signal present at the associated input. The first and second single-ended dividers thus divide the frequency of a signal present at the input by certain division ratio and make available at the output a clock signal with the divided frequency.

In addition, the frequency divider circuit also contains a feedback path, which is connected to the output of the push-pull divider and to the outputs of the first and second single-ended dividers. The feedback path comprises an evaluation circuit with a first and a second input. The first input of the evaluation circuit is connected to the first single-ended divider in such a way that it is possible to send a state of the clock signal which can be tapped at the output of the first single-ended divider to this first input before the clock signal which can be tapped at the output has assumed a predefined state. The second input is connected to the second single-ended divider in such a way that it is possible to send a state of the clock signal which can be tapped at the output of the second single-ended divider to this second input before the clock signal which can be tapped at the output has assumed a predefined state. In other words, it is possible to send signals which represent certain states of the clock signals transmitted from the first and second single-ended dividers, namely, signals representing states which the transmitted clock signals assume before they reach a predefined state, to the first and second inputs of the evaluation circuit. The evaluation circuit is configured to transmit a push-pull signal upon the occurrence of the predefined state of the first and second single-ended dividers in order to release the control signal of the push-pull divider.

The invention therefore takes into account not the respective output signals of the individual divider stages but rather the so-called "intermediate" signals in the feedback path present at the transition between the single-ended section and the push-pull section of a frequency divider circuit. These intermediate signals make it possible to infer states which will not actually exist until after the switching functions of the individual divider stages have occurred. What is evaluated is therefore a state of the clock signal transmitted by the divider stage in question before that state actually exists. A predefined state expected to occur in the future is therefore anticipated.

If the evaluation shows that the state which will occur in the future is the predefined state, the single-ended feedback signal is converted to a push-pull feedback signal. When this predefined state then actually does occur, the previously prepared push-pull signal is transmitted to release the control input of the push-pull divider. This offers the advantage of reducing the amount of time required to convert a single-ended feedback signal to a push-pull feedback signal. Because the time losses caused by conversion in the feedback path are avoided, it is therefore possible to use the single-ended divider technique to process clock signals of higher frequencies as well. The time required to detect the converted signal during the push-pull/single-ended conversion is also saved. Finally, the power consumption of the inventive frequency divider circuit is reduced.

In another embodiment, the predefined state of the clock signals is the state in which at least the clock signals which can be tapped at the outputs of all the single-ended dividers are at a low logical level. The low logical level is referred to in the following as "logical 0". The state in which all the clock signals which can be tapped at the outputs of the divider stages are at logical 0 means the end of a clock cycle of the divided output clock signal of the last divider of the frequency divider circuit. When this state is reached, the push-pull signal for releasing the control input of the push-pull divider is released by the inventive evaluation circuit.

As a result, the division ratio of the push-pull divider is changed in the desired manner, and a new clock cycle begins. In a similar manner, the predefined state of all the signals which can be tapped at the outputs can be defined in one embodiment as the state in which the clock signals which can be tapped at the outputs of the push-pull divider and of all the single-ended dividers are at a high logical level, which is referred to in the following as "logical 1".

In another embodiment, the first single-ended divider and/or the second single-ended divider has a control input, by means of which the division ratio of the first and/or of the second single-ended divider can be adjusted. The first and/or the second single-ended divider is thus configured to divide the frequency of the clock signal by an adjustable division ratio.

The feedback path, furthermore, is configured to release the control input of the first and/or of the second single-ended divider upon the occurrence of the predefined state of the clock signals of the first and second single-ended dividers which can be tapped at the outputs. The feedback path therefore releases the control inputs of the first and second single-ended dividers when the clock signals of the first and second single-ended dividers which can be tapped at the outputs both have a value of logical 0 or logical 1.

The feedback path is therefore configured to release the control signal of the single-ended divider in question when the clock signal which can be tapped at the its output and the clock signal which can be tapped at the outputs of all the single-ended dividers connected downline have reached the predefined state.

In another embodiment of the invention, at least one third single-ended divider with an adjustable frequency division ratio is connected downline from the output of the second single-ended divider. The evaluation circuit or means, furthermore, is provided with a third input, which is connected to the output of the at least one third single-ended divider. The evaluation circuit or means thus evaluates the clock signal present at the output of the third single-ended divider and the states of the clock signals in the first and second single-ended dividers before the predefined state in question is reached.

By the downline connection of additional single-ended dividers with adjustable frequency division ratios and by the connection of the outputs in question to the inputs of the evaluation circuit, it is possible to design a frequency divider circuit which can be adjusted to any desired division ratio. In the most suitable embodiment, only the first divider circuit is designed as a push-pull divider. Power consumption is significantly reduced.

In another embodiment of the invention, the evaluation circuit comprises a logical gate, which is connected to the inputs of the evaluation circuit. The intermediate states of the clock signals of the first and second single-ended dividers and the state of the clock signal of the at least one third single-ended divider can be easily linked by way of the logical gate. As a result, a signal is obtained, the state of which can be used to release the control input of the push-pull divider. In one example, the logical gate is a NOR gate. In an alternative embodiment, the logical gate is a NAND gate, the inputs of which are connected by way of an inverter to the inputs of the evaluation circuit.

In another embodiment, the evaluation circuit comprises a second converter device for single-ended/push-pull conversion, the input of which is connected to the output of the logical gate. The second converter device is connected in one example to the output of the logical gate by way of a flip-flop circuit, where a clock input of the flip-flop circuit is connected to the output of the first converter device. Each time the edge of a clock signal arrives from the push-pull divider, the flip-flop circuit transmits the state of its data input to its data output and thus to the second converter device.

The time therefore available to the second converter device to convert the single-ended feedback signal generated by the logical gate and sent on by the flip-flop into a push-pull feedback signal is equal to one cycle of the clock signal transmitted by the push-pull converter. It is advantageous in this context for the output of the second converter device to be connected to the data input of a second flip-flop circuit, the clock input of which is connected to the output of the push-pull divider. The second flip-flop circuit is configured for push-pull signal processing. The push-pull feedback signal converted by the converter device is used by the second flip-flop circuit to release the control input of the push-pull divider during the following clock cycle of the push-pull divider.

In yet another embodiment of the invention, the push-pull divider with an adjustable division ratio is designed as a ⅔-divider with switching suppression. In another embodiment of the invention, the first and the second single-ended dividers each comprise a first flip-flop circuit and a second flip-flop circuit. The clock inputs of the first and second flip-flop circuits are connected to the inputs of the associated single-ended dividers. A data output of the first flip-flop circuit is connected to a first input of a logical gate. A second input of the logical gate is connected to the data output of the second flip-flop circuit. An output of the logical gate is also connected to the data input of the second flip-flop circuit and to the first and/or second input of the evaluation circuit. The logical gate in one example is a NAND gate.

In another embodiment, the frequency divider circuit is configured as a positive edge-triggered frequency divider circuit. Thus all of the individual divider circuits are triggered by the rising edges of the clock signal. Alternatively, the inventive frequency divider circuit can also be configured with inverted logic. In this case, the push-pull dividers and the single-ended dividers of the inventive frequency divider circuit and the circuit elements present in them are negative or falling edge-triggered.

In accordance with another embodiment of the invention, the inventive method for frequency division in a frequency divider circuit with a controllable frequency division ratio is based on the availability of a frequency divider circuit. After the signal to be divided is sent to an input of the push-pull divider of the frequency divider circuit, the frequency of this signal is divided by the ratio set by the push-pull divider. The push-pull divider delivers a clock signal at the corresponding divided frequency. This clock signal is converted by the converter device into a single-ended signal, sent to the first single-ended divider, and subjected to further processing there. The method also includes the step by which a feedback signal is generated by tapping a certain state of the clock signal delivered by the first and second single-ended dividers, namely, a state which exists before the occurrence of a certain predefined state. The predefined state is derived from the states of the clock signals delivered by the push-pull divider and by the first and second single-ended dividers. Ultimately, the feedback signal is fed back to release the control input of the push-pull divider upon the occurrence of the predefined state.

According to one embodiment of the inventive method, therefore, a feedback signal is made available, which is generated by an evaluation of the states of the clock signals delivered by the first and second single-ended dividers. These states are present before a predefined state of the two clock signals exists. The predefined state is characterized in one example by a low logical level of all these clock signals. Alternatively, the predefined state is formed by a high logical level formed by the clock signals transmitted by the two single-ended dividers. The inventive method therefore implements a "look-ahead" technique in a frequency divider circuit with controllable division ratio. This technique makes it possible to anticipate an expected state and to make available signals which are activated as soon as the expected state actually occurs. As a result, the amount of time required in a feedback path to convert singled-ended feedback signals to push-pull feed back signals is reduced. Time is also saved in the forward path, that is, during the push-pull/single-ended conversion, because the occurrence of the state is anticipated even before the actual push-pull/single-ended conversion and the additional downline signal processing.

In another embodiment of the method, the feedback signal is fed back after the clock signal delivered by the push-pull divider is inverted. The control input of the push-pull divider is released when the feedback signal is present there together with the inverted clock signal. This guarantees that the control signal will not be present at the control input of the push-pull divider until the end of a complete cycle of the overall divided signal.

In another embodiment of the invention, the feedback signal is generated in that, when an edge of the divided clock signal delivered by the push-pull divider arrives, a single-ended feedback signal is generated before the clock signals of the first and second single-ended dividers are in the predefined state. The single-edged feedback signal thus generated is then converted to a push-pull feedback signal The feedback signal is generated again when the same type of edge arrives in the clock signal transmitted by the push-pull divider.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION O THE DRAWINGS

The invention is explained in detail below with reference to the drawings, which illustrate various exemplary embodiments:

DETAILED DESCRIPTION OF THE INVENTION

Figure 1:
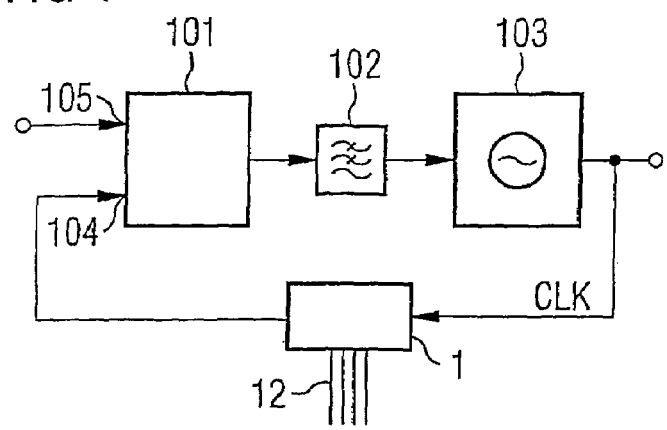
FIG. 1 is a block diagram illustrating a phase-locked loop with the inventive frequency divider circuit.

FIG. 1 shows a phase-locked loop, in the return path of which frequency divider circuits with adjustable division ratios are provided. The phase-locked loop comprises a forward path, which includes a phase detector 101, to which a low-pass filter 102 is connected. The low-pass filter 102 comprises a charge pump and is connected by an output to a control input of a voltage-controlled oscillator 103. The output of the voltage-controlled oscillator 103 is connected to an input of the inventive frequency divider circuit 1 and forms simultaneously an output of the phase-locked loop. The frequency divider circuit divides the clock signal CLK coming from the oscillator 103 by its division ratio, which is set via the control inputs 12, and sends the divided clock signal to a feedback input 104 of the phase detector 101. The phase detector 101 compares the frequency of the returned clock signal with a frequency of a reference signal and generates from that a control signal, which is sent via the low-pass filter 102 to the control input of the voltage-controlled oscillator 103.

The frequency of the output signal CLK of the voltage-controlled oscillator 103 is readjusted until the frequency of the fed-back signal which has been divided by the frequency divider circuit 1 matches the frequency of the reference signal at the input 105 of the phase detector 101.

Figure 2:
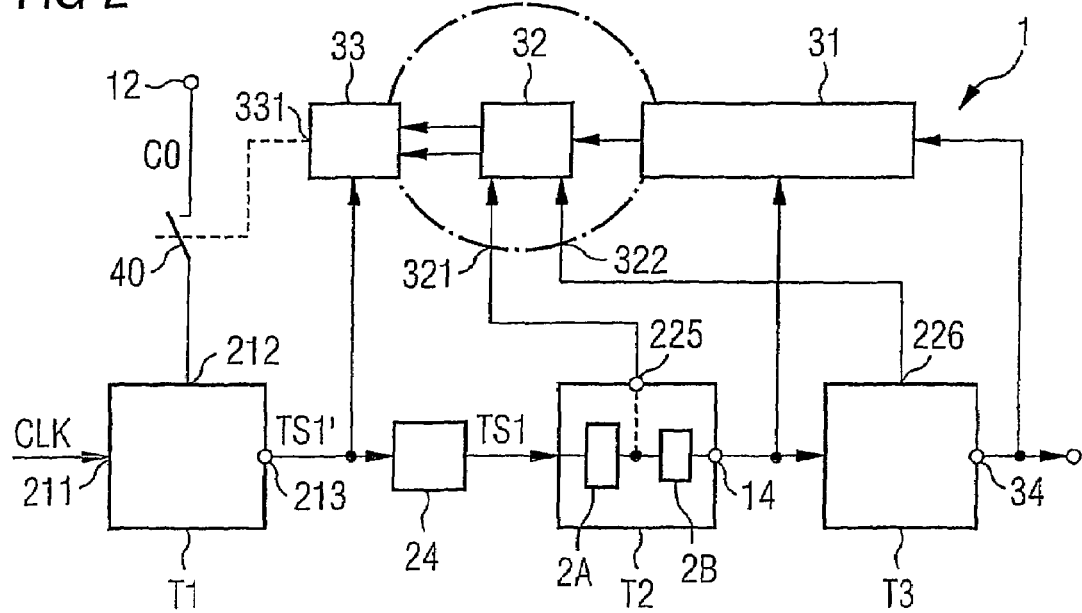
FIG. 2 is a block circuit diagram illustrating the inventive frequency divider circuit.

In phase-locked loops which generate signals CLK with very high output frequencies, the frequency divider circuits must therefore also process clock signals with high input frequencies. So that the greatest possible flexibility can be guaranteed at the same time, the frequency divider circuits are often designed as multimodulus dividers. FIG. 2 shows part of a divider circuit with an adjustable division ratio according to one embodiment of the invention.

The inventive frequency divider circuit can be divided in terms of its logical structure into a forward path and a reverse path. In the forward path, the frequency of the input-side push-pull signal CLK is divided according to the set frequency division ratio. The frequency division ratio is set by the control signal CO at the control input 12. The frequency of the input-side push-pull signal CLK is divided by several divider stages T1, T2, and T3 connected in series. In the exemplary embodiment, the divider stage T1 is designed as a synchronous push-pull divider with an adjustable division ratio. Depending on the control signal at the input 212, the synchronous push-pull divider T1 will divide the push-pull signal present at its input 211 either by a factor of 2 or, by the use of switching suppression, by a factor of 3.

The push-pull signal TS1' thus divided can be tapped at the output 213. The push-pull divider T1 shown here represents the last synchronous push-pull divider in the inventive frequency divider circuit 1. The input 211 of the synchronous push-pull divider T1 can therefore be connected to the outputs of additional synchronous push-pull dividers. Designing the input stages of the inventive frequency divider circuit as push-pull dividers is especially advantageous, in one embodiment, because push-pull dividers can process very high input frequencies and are relatively insensitive to interference signals on the clock line.

The output of the synchronous push-pull divider T1 is connected to an input of a converter stage 24. The converter stage converts the push-pull signal TS1' into a single-ended signal TS1. An input of a first single-ended divider T2 is connected to the output of the converter stage 24. A second single-ended divider T3 is connected by its input to the output 14 of the first single-ended divider T2. The inventive frequency divider circuit 1 can also comprise additional single-ended dividers connected in series.

The frequency of the clock signal present at the input side is divided in two stages in each of the single-ended dividers T2 and T3. In the case of the single-ended divider T2, this is indicated by the two circuit blocks 2A and 2B. The single-ended divider T3 comprises the same type of circuit blocks. For the sake of clarity, they have not been illustrated. The two circuit blocks 2A and 2B of the single-ended divider T2 process the input-side clock signal TS1 by dividing its frequency. Signals which contain information on a future state of the divided clock signal available at the output and thus on a future state of the entire single-ended divider are also exchanged between the circuit blocks 2A and 2B. The generation of these signals and the information concerning a future state of a tappable clock signal will be explained more fully below on the basis of additional exemplary embodiments.

The inventive frequency divider circuit also comprises a reverse or feedback path, which, in the embodiment shown here, comprises the elements 31, 32, 33, which are connected to each other. The feedback path is also connected by its output 331 to a switch 40, which is connected between the control input 212 of the synchronous push-pull divider T1 and the control input 12 of the frequency divider circuit. The feedback path is configured so that it closes the switch 40 only after the entire frequency division cycle has been completed. The feedback path thus releases the control input 212 of the push-pull divider T1 only at the end of a clock cycle of the divided clock signal. This guarantees that the synchronous push-pull divider divides by the factor of 3 only once per complete cycle.

So that the time at which the switch 40 is to be released can be determined, each of the individual elements 31 and 33 of the feedback path has an input, which is connected to an output of one of the divider stages of the frequency divider circuit. The element 32 of the feedback path is connected by its inputs 321 and 322 to the intermediate signal outputs 225 and 226 of the single-ended dividers 22 and 23. At these outputs, intermediate signals which contain information on the future state of a clock signal available at the outputs 14 and 34 can be tapped. The element 32 is configured as an evaluation circuit, which evaluates these intermediate signals and passes along a push-pull feedback signal to the element 33 of the feedback path as soon as a complete clock cycle of the overall signal has run its course.

The signals which are tapped at the intermediate signal outputs 225, 226 are in one example signals with a level that is reached only when the next edge of the clock signal which can be tapped at the outputs 14 and 34 arrives. For example, the intermediate signal at the output 225 of the first single-ended divider T2 has a value of logical 0 when the clock signal at the output 14 is at a high logical level and vice versa. The intermediate signals therefore represent future level states of the clock signals available at the outputs. The evaluation circuit 32 evaluates these states and generates from them a push-pull signal, which is sent on to the next element 33 of the feedback path. The element 33 in the feedback path is designed to process push-pull signals.

By using the intermediate signals to evaluate future states of the individual clock signals delivered by the divider stages 22 and 23, it is therefore possible to prepare and generate in advance the feedback signal which releases the switching means 40. As soon as the individual clock signals actually reach the state in question, the feedback signal can be used without any delay to release the control input 212. Because converting a push-pull signal into a single-ended signal in particular is very time-consuming, the evaluation of the future states of clock signals makes it possible to save time precisely in the case of high input frequencies. The push-pull/single-ended conversion and/or the single-ended/push-pull conversion can therefore be carried out even at high frequencies.

Figure 3:
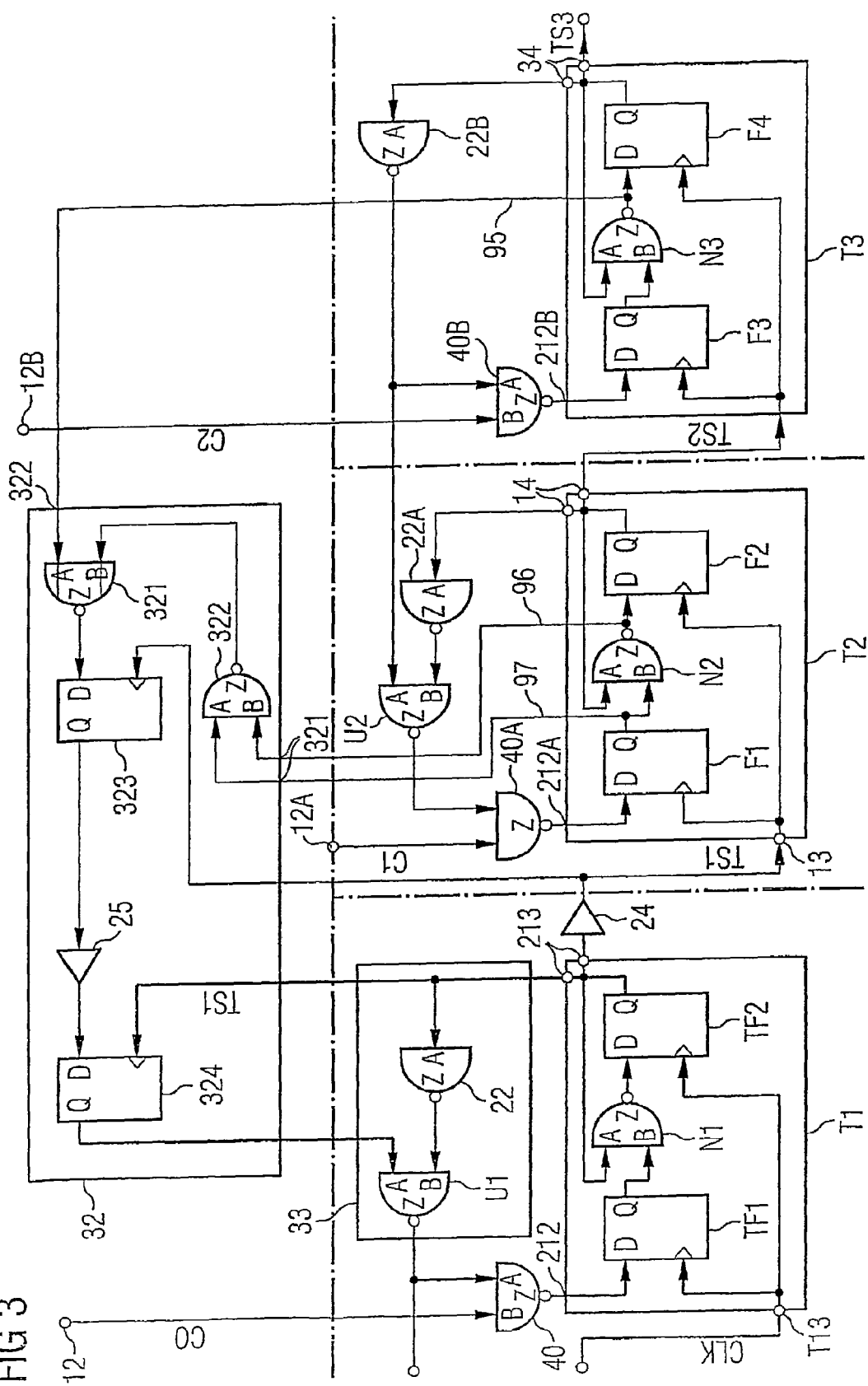
FIG. 3 is a logic diagram illustrating a first exemplary embodiment of the inventive frequency divider circuit.

FIG. 3 shows one concrete exemplary embodiment of the inventive frequency divider circuit. The same components carry the same reference numbers. The inventive frequency divider circuit comprises a first divider stage T1 and second divider stages T2 and T3, connected to the first stage. The first divider stage T1 is configured as a synchronous push-pull divider with switching suppression. The vertical broken lines indicate the boundary between push-pull signal processing and single-ended signal processing. An exemplary embodiment of the evaluation circuit is shown above the horizontal broken line.

The input T13 of the synchronous push-pull divider T1 is connected to the clock input of a first flip-flop TF1 and to the clock input of a second flip-flop TF2. The first flip-flop TF1 serves to set the frequency division ratio of the first push-pull divider T1. For this purpose, its data input D is connected to the control input 212 of the synchronous push-pull divider T1. The data output Q of the first flip-flop TF1 is connected to the input B of a logical NAND gate N1, which forms a part of a feedback loop for the second flip-flop TF2. The data output Q of the second flip-flop TF2 forms the output 213 of the push-pull divider T1 and is also connected to the input A of the logical NAND gate N1. The two flip-flops TF1 and TF2 are designed as positive or rising edge-triggered flip-flops.

The divider circuit T1 divides the push-pull signal CLK present on the input side by a factor of 2 or 3, depending on the control signal at the control input 212. A division of the frequency of the input-side push-pull clock signal CLK by a factor of 3 is accomplished by suppressing switching for the duration of one cycle of the clock signal CLK. Switching is suppressed whenever the control signal at the input 212 is at a logically low level. When a rising edge of the input-side clock signal CLK arrives, the first flip-flop TF1 produces a logical 0 at its data output Q and thus forces the output signal of the NAND gate to assume a high logical level or "logical 1". If the control signal at the input 212 remains at logical 0 for the duration of one clock cycle of the clock signal CLK, switching will be suppressed in the output signal of the first push-pull divider T1 for half a clock cycle of the output push-pull clock signal TS1'. This is equivalent to dividing the frequency by a factor of 3.

The other dividers T2 and T3 are built in a similar manner. The dividers T2 and T3 differ from the push-pull divider T1, however, in that they are designed as single-ended dividers. In contrast to divider T1, they do not process push-pull signals but process instead the single-ended signals TS1, TS2. For this purpose, the flip-flop circuits F1, F2 and F3, F4 as well as the NAND gates N2 and N3 are configured to process single-ended signals. The structural design of the individual divider stages T2 and T3, however, is the same as that of the push-pull divider T1. So that the push-pull clock signal TS1' available at the output of the push-pull divider T1 can be converted, the inventive frequency divider circuit has a push-pull/single-ended converter 24, which is inserted between the output 213 of the push-pull divider T1 and the input 13 of the first single-ended divider T2.

The two single-ended dividers T2 and T3 have control inputs 212A and 212B, respectively, to which a control signal can be sent to adjust the division ratio to either a factor of 2 or a factor of 3. To send the control signals to the control inputs at the right time, it is necessary for the NAND gates 40, 40A, and 40B, which act as switches, to be released only at the end of a clock cycle of the clock signal available at the output of the inventive frequency divider circuit. In the exemplary embodiment according to FIG. 3, this is the end of a clock cycle of the signal TS3.

For this purpose, an inverter 22B is provided in the feedback path. The inverter is connected to the output 34 of the divider T3, and its output is connected to the input A of the switch 40B and to the input A of a logical AND gate U2. The switch 40B is configured as a logical NAND gate. The output of the switch 40B is connected to the control input 212B. Simultaneously, the output 14 of the first single-ended divider T2 is connected via an inverter 22A to the input B of the logical AND gate U2. The output of the logical AND gate U2 is connected to an input of an additional switching means 40A, which is configured as a NAND gate. The output of this gate leads to the control input 212A. The inverters 22B, 22A and the gate U2 form the element 31 of the feedback path.

The second single-ended divider T3 also contains a tap 95 between the output of the NAND feedback gate N3 and the second flip-flop F4. This tap 95 carries an intermediate signal, which represents a future state of the clock signal TS3 at the output 34. As a result of the feedback in the single-ended divider T3, the level of the signal at the tap T3 is that of the signal which is sent along as the clock signal TS3 to the output 34 when the next rising edge of the signal TS2 arrives. In the same way, a tap 96 is provided in the first single-ended divider T2. The signal at the tap 96 represents the clock signal TS2, which, when the next rising edge of the input-side clock signal TS1 arrives, is received by the flip-flop F2 and can be tapped at the output 14.

These intermediate signals at the taps 95 and 96 are sent to an evaluation unit 32 in the feedback path. The evaluation unit contains a NOR gate 321, the first input A of which is connected to the tap 95. The second input B is connected via a NAND element 322 to the tap 96 of the first single-ended divider T2 and to a tap 97. The tap 97 carries the data output signal Q of the first flip-flop F1 of the first single-ended divider T2. It is necessary to take into account the signal at the tap 97 in this embodiment, because a state with a logically high level at the intermediate tap 96 can arise twice during a complete clock cycle when the frequency is being divided by a factor of 3. On division by 3, the signal at the tap 97, however, has a value of logical 0 once and then a value of logical 1 once. The state which is important is that in which high levels can be tapped at both taps 96 and 97. The output of the NOR gate 321 of the evaluation means 32 is connected to the data input of a flip-flop 323, which is activated by the single-ended clock signal TS1 transmitted from the converter device 24. The data output Q of the flip-flop 323 is connected to a single-ended/push-pull converter 25. This converts a single-ended signal into the corresponding push-pull signal.

The output of the single-ended/push-pull converter 25 is connected to the data input of another flip-flop 324, which is configured to process the push-pull signals. The clock input of the flip-flop 324 is connected to the output 213 of the push-pull divider T1. The push-pull signal output Q of the flip-flop circuit 324 leads to the feedback element 33 of the feedback path. The feedback element 33 comprises a logical AND gate U1, the input B of which is connected by way of an inverter 22 to the output 213 of the push-pull divider T1. The input A of the logical AND gate U1 forms the input of the feedback element 33 for the feedback signal and is connected to the data output Q of the flip-flop 324 of the evaluation means 32. The output of the logical AND gate is connected to a first input A of a switching means 40, the output of which is connected to the control input 212 of the push-pull divider T1. A second input B of the switching means 40 forms the control input 12.

The part of the inventive frequency divider circuit shown here can be expanded by the addition of further feedback elements and by the connection of the clock signal input for the clock signal CLK to the output of other push-pull frequency divider circuits.

Figure 5A:
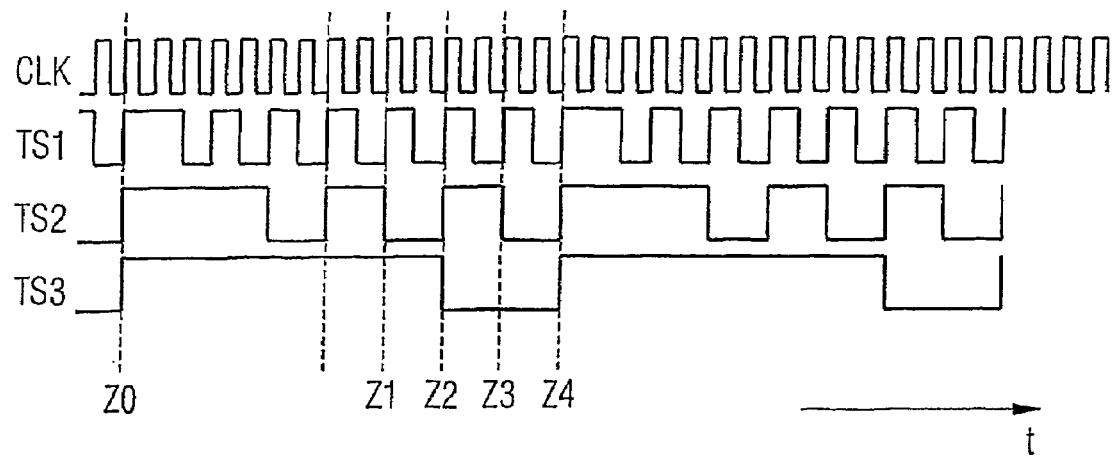
FIG. 5A is a first time diagram illustrating various clock signals in accordance with an embodiment of the invention.

The way in which the evaluation circuit in the inventive frequency divider circuit according to FIG. 3 works will now be explained on the basis of the time diagram of FIG. 5A. This shows several clock signals as a function of time. In the exemplary embodiment according to FIG. 3, it is assumed that the control signals C0, C1, and C2 at the control inputs 12, 12A, and 12B are such that the divider circuits T1, T2, and T3 suppress switching. As a result, each of the divider circuits divides by the factor of 3. The signals CLK, TS1, and TS3 shown in the diagram are important for the explanation of the way in which the frequency divider circuit according to FIG. 3 works.

The clock signal CLK is sent to the input side of the first divider circuit T1 at time Z0. A signal at a logically high level continues to be present at the input A and also at the input B of the NAND gate 40. This results in a logically low level at the data input D of the first flip-flop TF1 of the push-pull divider T1; this logically low level leads to the suppression of switching for the subsequent cycle. As a result, the signal TS1 at the output remains at logical 1. As a result of the feedback through the inverter 22, a logical 0 is obtained at the output of the logical AND gate U1, as a result of which a logical 1 is present again at the input 212 of the push-pull divider T1. The first and second single-ended dividers, each of which suppresses switching for one clock cycle of its input signal, work in the same way.

At time Z1, the clock signal TS2 with a logical 0 is present at the output 14 of the first single-ended divider T2. As a result, an intermediate signal at logical 1 is present at the tap 96. At the same time, the data output Q of the first flip-flop F1 of the first single-ended divider T2 and thus the tap 97 are also at logical 1. The NAND gate 322 sends a logical 0 to the NOR gate 321. At the same time Z1, the clock signal TS3 at the output 34 of the second single-ended divider T3 is at a logically high level. The resulting intermediate signal at the tap 95 is also sent to an input of the NOR gate 321. The NOR gate sends a logically high level to the data input of the flip-flop 323, and this logically high level is received at time Z2, when the next rising edge of the clock signal TS1 arrives.

During the clock cycle of the clock signal TS1 which now follows, the single-ended/push-pull converter can convert the fed-back single-ended signal with a logically high level to a corresponding push-pull signal and make it available at the data input D of the flip-flop 324. This signal is received at the output of the flip-flop 324 when the next rising edge of the clock signal TS1 arrives at time Z3 and is sent to the input A of the AND gate U1. At time Z3, the signal TS1 switches to a logical 1. Simultaneously, the signal TS2 and also the signal TS3, however, are already at a logically low level. As a result, the switching means 40B and 40A have already been released, so that the corresponding control signals C2 and C1 at the control inputs 12A and 12B can be sent along to the associated data inputs of the flip-flops F1 and F3. The intermediate signals at the taps 95 and 96 change back again to logical 1 at time Z3. The NOR gate 321 of the evaluation circuit 32 generates a logical 0 again at its output on the basis of the intermediate signals.

When the next falling edge of the first clock signal TS1 arrives, the feedback element 33 changes the input A of the gate 40 to logical 1, so that the corresponding control signals C0, C1, and C2 are now present at the control inputs 212 of each of the dividers. The time Z4 determines the start of a new clock cycle of the clock signal TS3. The single-ended/push-pull conversion of the feedback signal for releasing the switching means 40 is accomplished during the period from Z2 to Z3, so that this signal can be sent to the feedback element when the rising edge arrives at time Z3. Because the feedback signal is generated in a preceding cycle and then made available at the proper time, the converter element 25 can be of an especially simple design. The conversion of the single-ended signal to a push-pull signal is thus no longer critical with respect to time.

Figure 4:
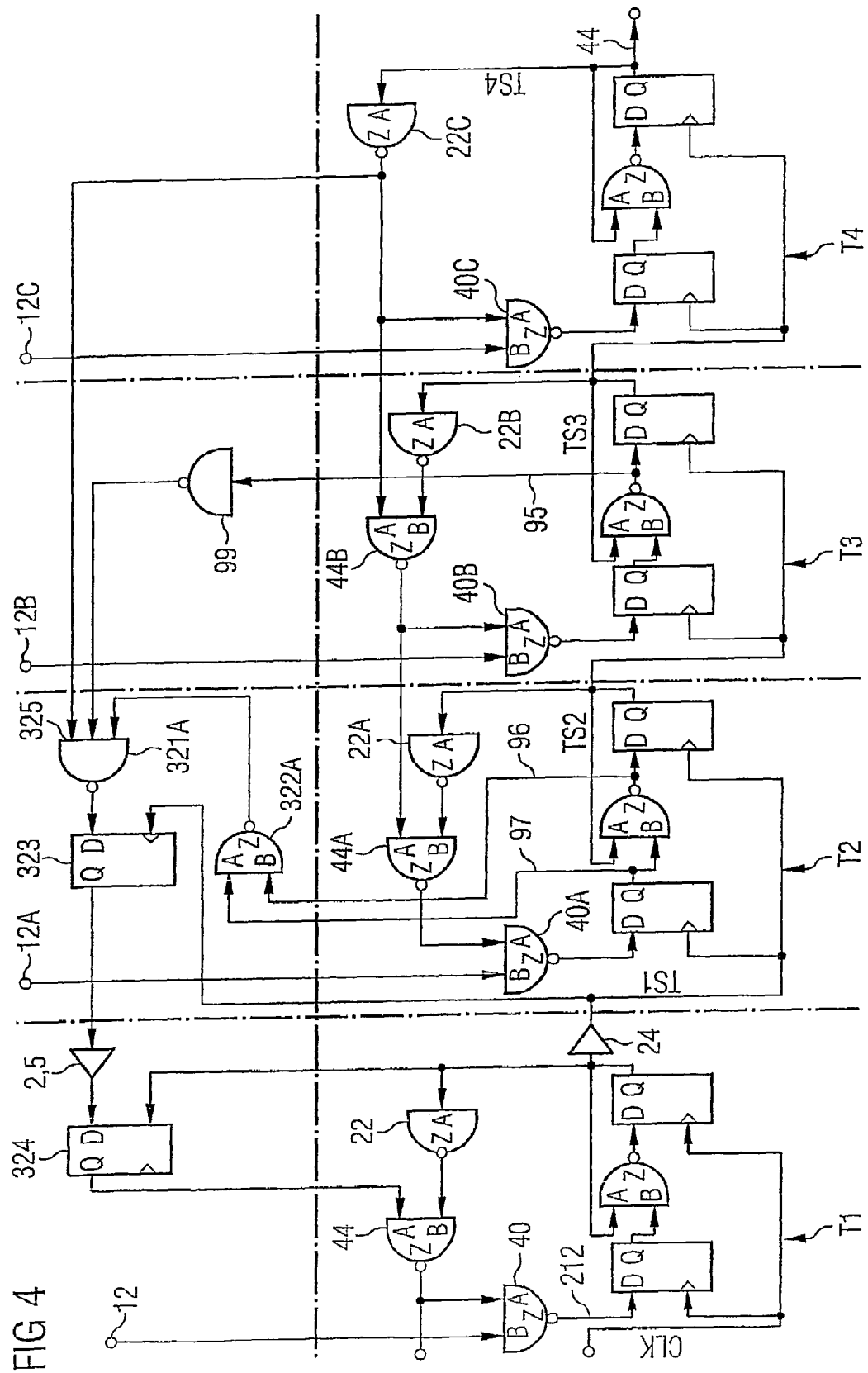
FIG. 4 is a logic diagram illustrating a second exemplary embodiment of the inventive frequency divider circuit.

FIG. 4 shows another embodiment of an inventive frequency divider circuit with a push-pull divider T1 and three series-connected single-ended dividers T2, T3, and T4. In this embodiment as well, additional push-pull dividers can be inserted in front of the input of the push-pull divider T1, and the output of the single-ended divider T4 can also be connected to additional single-ended dividers T5. The third single-ended divider T4 is built in the same way as the first and second single-ended dividers T2, T3. It, too, comprises two flip-flop circuits, where the first flip-flop circuit is configured to set the division ratio. A switch 40C connects the data input D of the first flip-flop to the control input 12C. This switch, too, is configured as a NAND gate.

The evaluation circuit here has a slightly modified design. Instead of the NOR gate 321 used in FIG. 3, an AND gate 321A is implemented. This gate has three inputs. If the input signals at the inputs of an AND gate are inverted, the AND gate has the same truth table as a NOR gate. For this reason, the intermediate signal at the tap 95 of the second single-ended divider T3 is inverted by an inverter 99 and sent to an input of the logical AND gate 321A. The taps 96 and 97 of the first single-ended divider T2 are connected to the inputs of a logical AND gate 322A, the output of which is connected to an input of the logical AND gate 321A.

It is also necessary to take into account the output clock signal TS4 of the third single-ended divider T4. For this purpose, the logical AND gate 321A has an additional input, which is connected via an inverter 22C to the output 44 of the third single-ended divider T4. The inverter 22C simultaneously forms a part of the feedback path. The clock signal TS4 can be tapped at the output 44. The inventive frequency divider circuit can be expanded to any desired extent by connecting additional single-ended dividers to the output 44, each of the outputs of these additional dividers being connected by way of an inverter to an additional input of the logical AND gate 321A.

The output of the inverter 22C also leads to an input of a switch 40C and to an input A of an AND gate 44B, which is part of the feedback element 33 of the feedback path. The feedback path releases the NAND gate 40A, 40B, or 40C in question only when the output signal of the associated single-ended divider and the output signals of all the down-line single-ended divider are at logical 0.

Figure 5B:
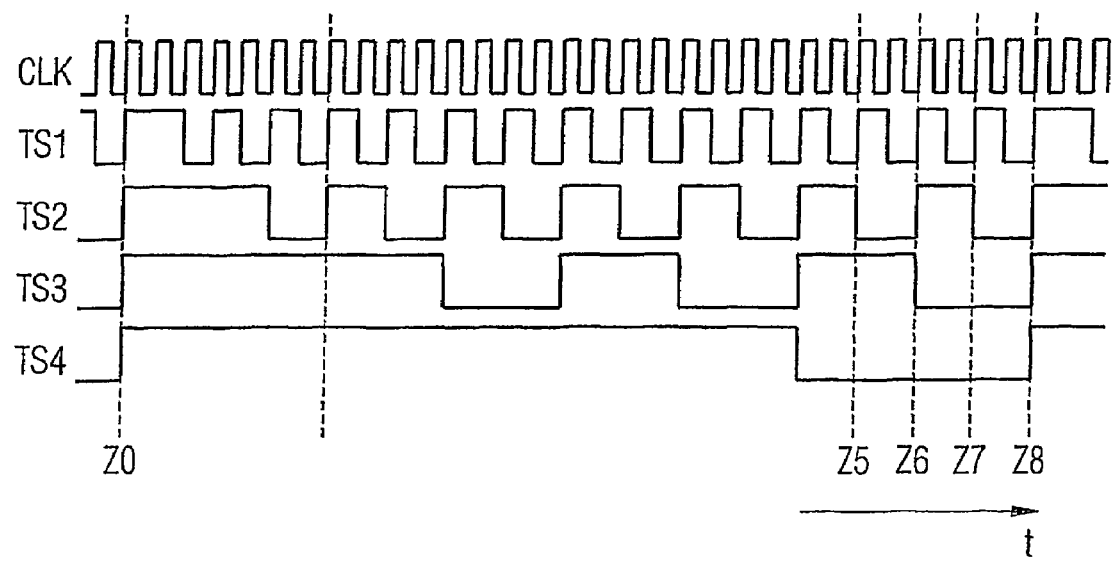
FIG. 5B is a second time diagram illustrating various clock signals in accordance with an embodiment of the invention.
Figure 6:
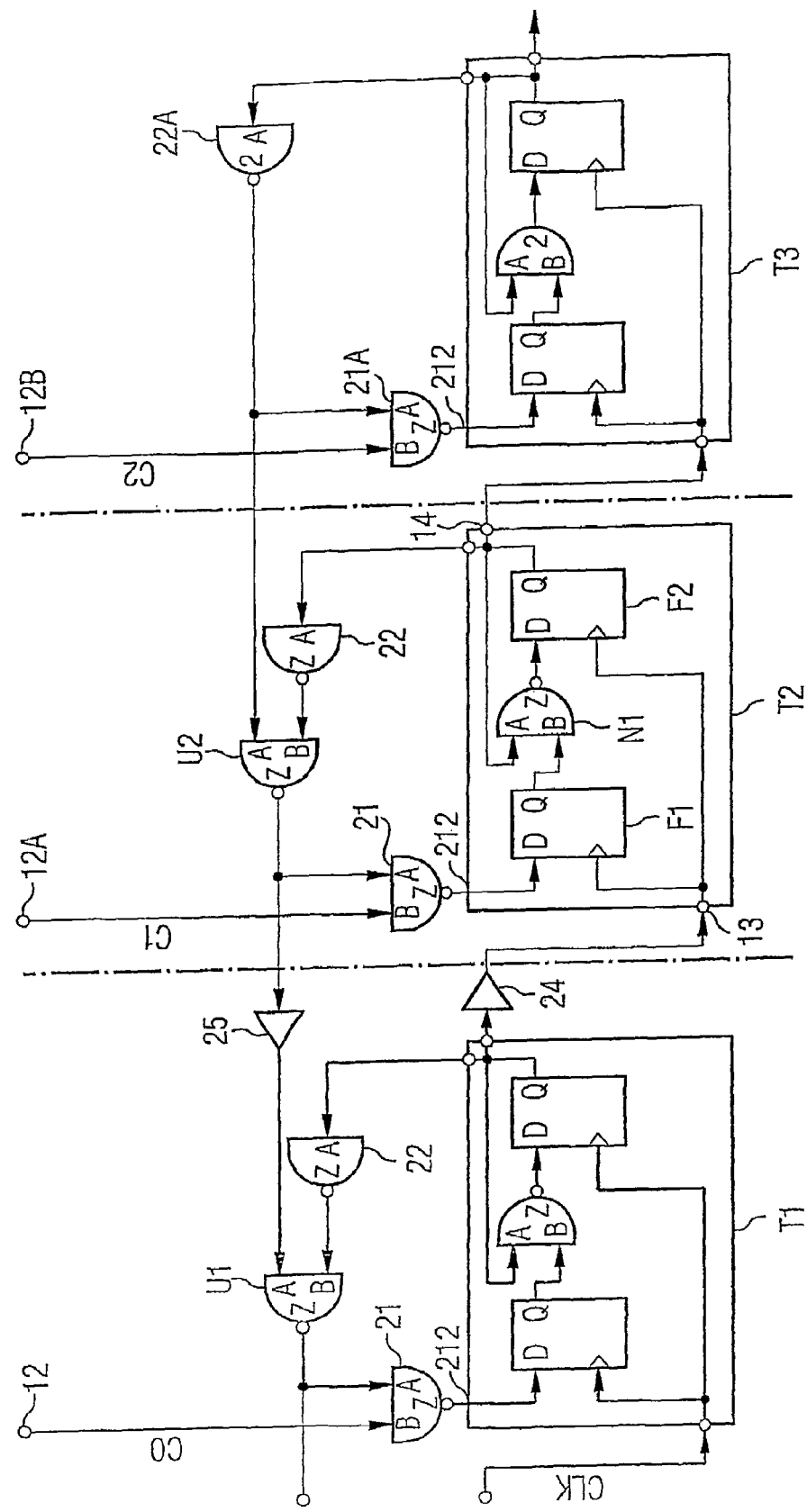
FIG. 6 is a logic diagram illustrating a known embodiment of a frequency divider circuit.

FIG. 5B shows the change in the delivered clock signals over time. It is assumed again that all of the control signals are of such a kind that switching is suppressed, so that each divider of the circuit divides by a factor of 3. Shortly before time Z5, the clock signal TS4 is at a logically low level. This is inverted and sent to the switching means 40C, which then releases the data input of the first flip-flop for the control signal at the control input 12C. Simultaneously, the signal travels along the feedback chain to the AND gate 44B. This gate generates a signal at a logically high level if at the same time the signal TS3 from the single-ended divider T3 is at logical 0. This is the case starting at time Z6. As a result, the switch 40B is released, and the feedback signal propagates to the logical gate 44A. Shortly after time Z7, the switches 40A, 40B and 40C are released, and the single-ended dividers T2, T3, and T4 can suppress switching as a function of the control signals present at the control inputs 12A, 12B, and 12C.

At time Z5, the inverted clock signal TS4 is also sent to the logical gate 321A. Simultaneously, it releases the control input of the single-ended divider T4. At this point, however, the output signal TS3 continues to be at a logically high level, i.e., at logical 1, as a result of which the gate 44B is still blocking the feedback signal. The intermediate signal at the tap 95, however, has a value of logical 0. This future state of the clock signal TS3 is inverted by the inverter 99 and sent to a second input of the logical AND gate 321A. The switch 40B and the logical AND gate 44A, however, have not yet been released.

At this time Z5, furthermore, the signal TS2 becomes logical 0. The intermediate signal at the tap 96, which indicates the future state of the clock signal TS2, as well as the intermediate signal at the tap 97 are both at logical 1. As a result, a logical 1 is also obtained at the output of the logical AND gate 322A, and this logical 1 is sent to the third input of the logical AND gate 321A. The output of the AND gate 321A of the evaluation circuit therefore switches the data input of the flip-flop-323 to a logical 1 during this period. When the next rising edge of the clock signal TS1 arrives at time Z6, the signal with the logically high level is received at the data input D of the flip-flop 323 and sent to the converter device 25. This converter now has the time until the next rising edge of the signal TS1 arrives to convert the single-ended feedback signal at logical 1 to a corresponding push-pull feedback signal.

When the rising edge of the clock signal TS1 arrives at time Z6, the clock signal TS2 also changes to logical 1, and the clock signal TS3 changes to logical 0. As a result, the AND gate 44B releases the switch 40B, and the feedback signal travels to the input of the logical AND gate 44A in the feedback path.

When the next rising edge of the clock signal TS1 arrives at time Z7, the clock signal TS2 changes to a logically low level, as a result of which the switch 40A is also released. The corresponding control signal for setting the frequency division ratio of the single-ended divider in question is now present at the corresponding control inputs of the dividers T2, T3, and T4. Simultaneously, when the rising edge of the clock signal TS1 arrives, the push-pull feedback signal converted by the converter device 25 is accepted by the data output Q of the flip-flop 324. When the next falling edge of the clock signal TS1 arrives, the inverter 22 and the AND gate 44 have the effect of releasing the control input 212 of the push-pull divider T1 as well. Thus the division ratio of the inventive frequency divider circuit is set, and the clock signal CLK present on the input side is divided in correspondence with the set frequency division ratio when the next rising edge arrives at time Z8.

The invention presented here is not limited to the exemplary embodiments shown. Thus, for example, the individual divider circuits can also be negative or falling edge-triggered. It is also possible for the individual logical elements to be replaced by corresponding equivalents. For example, it is possible for the various release switches for the input 212 to be logical AND gates with a downline inverter instead of NAND gates. The inverting output QN of each of the first flip-flop circuits can be used without the downline inverter. In principle, the entire circuit can be easily realized with OR-gate logic instead of with the AND gates used. In the case of push-pull signal processing, for example, it is sufficient merely to exchange the two lines of the inverter. It is also possible to use dividers completely different from the ⅔-dividers presented here.

For the interface between the push-pull feedback path and the single-ended feedback path, however, an evaluation circuit is provided which does not use the output signals of the individual dividers for the feedback; instead, it uses intermediate signals. These intermediate signals allow conclusions to be drawn concerning states which will not exist until after switching functions have occurred in the first and second single-ended dividers. An expected state is therefore anticipated in the feedback branch and activated by the same edge which in effect actually produces the anticipated state. In this way, time is saved in the feedback logic circuit, i.e., the time which is necessary to convert the expected state in the feedback path from single-ended feedback signals to push-pull feedback signals. In addition, the state of the single-ended signal in the forward path of the divider is also anticipated. The very time-consuming conversion of the push-pull signal into a single-ended signal and thus the switching of the divider flip-flop are therefore no longer relevant to the feedback signal, because the expected state has already been anticipated.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising." Additionally, the term "exemplary" is intended to indicate an example and not a best or superior aspect or implementation.

The invention claimed is:

1. A frequency divider circuit with adjustable frequency division ratio comprising:
   a push-pull divider with a frequency division ratio which can be adjusted at a control input, and configured to receive a first push-pull signal at a first frequency and output a second push-pull divider signal at a second frequency derived from the frequency division ratio at an output thereof;
   a first converter device connected to the output of the push-pull divider and configured to convert the second push-pull divider signal to a single-ended divider signal;
   a first single-ended divider with an adjustable frequency division ratio, and configured to output at an output thereof a third clock signal at a third frequency, where the third frequency is derived from the second frequency of the single-ended divider signal from the first converter device and the frequency division ratio;
   a second single-ended divider with an adjustable frequency division ratio, and connected to the output of the first single-ended divider, and configured to output a fourth clock signal at a fourth frequency, where the fourth frequency is derived from the third frequency of the third clock signal and the frequency division ratio; and
   a feedback path connected to the output of the push-pull divider and to the outputs of the first and second single-ended dividers, the feedback path comprising an evaluation circuit with a first input and a second input, the first input connected to the first single-ended divider and configured to receive future state of the third clock signal signal and the second input connected to the second single-ended divider and configured to receive a future state of the fourth clock signal, and wherein the evaluation circuit is configured to output a push-pull signal upon the occurrence of a predefined state of the third and fourth clock signals of the first and second single-ended dividers, wherein the push-pull signal is operable to release the control input of the push-pull divider.

2. The frequency divider circuit of claim 1, wherein the predefined state comprises a state in which the third and fourth clock signals are at a low level.

3. The frequency divider circuit of claim 1, wherein the predefined state comprises a state in which the third and fourth clock signals are at a high level.

4. The frequency divider circuit of claim 1, wherein the first single-ended divider is configured to divide the frequency of the single-ended divider signal by a frequency division ratio that is adjusted by a control signal at a control input thereof, and wherein the feedback path is configured to release the control input of the first single-ended divider upon the occurrence of a predefined state of the third and fourth clock signals.

5. The frequency divider circuit of claim 1, wherein the second single-ended divider is configured to divide the frequency of the third clock signal by a frequency division ratio that is adjusted by a control signal at a control input thereof, and wherein the feedback path is configured to release the control input of the second single-ended divider upon the occurrence of a predefined state of the fourth clock signal.

6. The frequency divider circuit of claim 1, further comprising at least one third single-ended divider with adjustable frequency divider ratio connected to the output of the second single-ended divider, and wherein the evaluation circuit comprises a third input connected to an output of the at least one third single-ended divider.

7. The frequency divider circuit of claim 1, wherein the inputs of the evaluation circuit are connected to a logic gate circuit.

8. The frequency divider circuit of claim 7, wherein the evaluation circuit further comprises a second converter device having an input connected to the output of the logic gate circuit, wherein the second converter device is configured to convert a single-ended signal into a push-pull signal.

9. The frequency divider circuit of claim 8, wherein the second converter device is connected via a flip-flop circuit to the output of the logic gate circuit, and wherein a clock input of the flip-flop circuit is connected to the first converter device.

10. The frequency divider circuit of claim 7, wherein the logic gate circuit comprises a NOR gate or an AND gate with inverted inputs.

11. The frequency divider circuit of claim 1, wherein the feedback path further comprises a NAND gate, a first input of which is connected to the output of the push-pull divider, a second input of which is connected to the evaluation circuit, and the output of which is connected to the control input of the push-pull divider.

12. The frequency divider circuit of claim 1, wherein the push-pull divider or the second single-ended divider is configured to suppress a switching of an output level of an output signal associated therewith for half a clock cycle of an input-side signal as a function of the control signal at the control input thereof.

13. The frequency divider circuit of claim 1, wherein the first or the second single-ended divider comprises a first flip-flop circuit and a second flip-flop circuit, the clock inputs of which are connected to the associated input of the single-ended divider, and comprising a data output of the first flip-flop circuit is connected to a first input of a gate, and a second input of the gate is connected to a data output of the second flip-flop circuit, and wherein an output of the gate is connected to the data input of the second flip-flop circuit and to the first or second input of the evaluation circuit, respectively.

14. The frequency divider circuit of claim 13, wherein the data output of the first flip-flop circuit of the first single-ended divider and the output of the gate of the first single-ended divider are connected by way of a NAND gate to the first input of the evaluation circuit.

15. The frequency divider circuit of claim 1, wherein the frequency divider circuit is configured as a negative or falling edge-triggered frequency divider circuit.

16. A method for frequency division in a frequency divider circuit with a controllable frequency division ratio, comprising:
providing a frequency divider circuit with a controllable frequency division ratio;
sending a clock signal to an input of a push-pull divider of the frequency divider circuit and delivering a divided clock signal at a divided frequency after the frequency of the clock signal has been divided by the push-pull divider;
generating a feedback signal by tapping a future state of the divided clock signal delivered by a first and a second single-ended divider, wherein the future state is present before a predefined state, and wherein the predefined state is derived from the divided clock signal delivered by the push-pull divider and from further divided clock signals delivered by the first and second single-ended dividers; and
returning the feedback signal to release a control input of the push-pull divider upon the occurrence of the predefined state.

17. The method of claim 16, wherein returning the feedback signal comprises:
inverting the clock signal delivered by the push-pull divider; and
releasing the control input of the push-pull divider when the feedback signal is present together with the inverted clock signal delivered by the push-pull divider.

18. The method of claim 16, wherein generating the feedback signal comprises:
generating a single-ended feedback signal upon the occurrence of an edge of the clock signal delivered by the push-pull divider before the further divided clock signals delivered by the first and second single-ended dividers are present in the predefined state;
converting the generated single-ended feedback signal to a push-pull feedback signal; and
generating the feedback signal upon the occurrence of the next edge of the same type in the clock signal delivered by the push-pull divider.

* * * * *